United States Patent
Kim

[19]

[11] Patent Number: 5,839,177
[45] Date of Patent: Nov. 24, 1998

[54] PNEUMATIC ROD LOADING APPARATUS

[75] Inventor: Chulho Kim, Burke, Va.

[73] Assignee: The United States of America as represented by the Secretary of the Navy, Washington, D.C.

[21] Appl. No.: 510,633

[22] Filed: Aug. 3, 1995

[51] Int. Cl.⁶ ................................................. H01L 41/22
[52] U.S. Cl. ........................ 29/25.35; 198/382; 198/396
[58] Field of Search ........................... 29/25.35; 198/382, 198/396

[56] References Cited

U.S. PATENT DOCUMENTS 3,250,372  5/1966  Wagner et al. ........................ 198/396
4,352,440  10/1982  Fukai et al. ........................ 198/396 X

*Primary Examiner*—Carl E. Hall
*Attorney, Agent, or Firm*—Thomas E. McDonnell; George Kap

[57] ABSTRACT

A rod feeder assembly composed of elongated tubular members arranged in vertical courses and disposed in a box, the tubular members being flush at their downstream end and provided with a loading section at the upstream or the opposite end. The tubular members are of the same length in the same course but are shorter in the upper courses. The method for automatically feeding rods into a matrix includes the steps of randomly disposing the rods on the loading sections of the tubular members, aligning and positioning the rods in the tubular members by vibrating the tubular members in an inclined disposition, and transferring the rods from the rod feeder assembly to the matrix.

9 Claims, 3 Drawing Sheets

PNEUMATIC ROD LOADING APPARATUS

FIELD OF THE INVENTION

This invention pertains to the field of rod feeder assemblies and to a method for feeding rods into a perforated matrix.

BACKGROUND OF THE INVENTION

A variety of electro-mechanical transducers such as hydrophones, air sensors, vibration sensors, pressure and stress sensors depend on the piezoelectric phenomenon exhibited by certain piezoelectric crystals, polarized ceramics, and polarized polymers.

Known transducers have a plurality of spaced, parallel piezoelectric rods embedded in a resin between a pair of spaced conducting plates disposed transversely to the rods. The resin can transmit hydrostatic pressure fluctuations to the sides of the rods. For this reason, the known transducers referred to above transmit the lateral component of hydrostatic pressure fluctuations to the rods.

The transducers noted in the previous paragraph are assembled in accordance with a costly and time-consuming procedure. This assembly procedure involves preparing a solid polymer matrix of a certain thickness with a plurality of spaced cylindrical openings or wells larger in diameter than the rods but corresponding to the desired spacing and location of the rods. The openings of desired size in the polymer matrix can be drilled and the conductive armature plates are cut from sheet metal. The rods are positioned in a predetermined arrangement on a conducting armature plate and bonded thereto with a conducting adhesive. Then the polymer matrix is positioned on the conducting armature plate and secured to the plate with a suitable adhesive. In such a configuration, the rods are disposed in the wells of the polymer matrix, with the rods and the matrix secured to the underlying conducting armature plate. Another conducting plate is then bonded to the upper level of the rods and the polymer matrix. The rods are then ground so that the rods and the polymer matrix are in the same horizontal plane.

The transducers disclosed in U.S. Pat. No 5,325,011 are composed of stacked preforms having upper and lower grooves, piezoelectric rods disposed in pockets formed by cooperating upper and lower grooves of the stacked preforms, and a soft resin disposed around each rod. The preforms are corrugated and are made from a thermoplastic hard resin, such as polyphthalimide or polycarbonate, by injection molding with or without reinforcement.

The transducers disclosed in U.S. Pat. No. 5,325,011 can be made by loading the rods into a vibrating hopper having an inclined surface and an exit at the lower extremity thereof so that the rods are aligned in one direction. A preform is positioned beneath the hopper so that the upper grooves thereof are disposed below the hopper exit and are aligned in the same direction as the rods. The rods are conveyed along at least one inclined surface of the hopper towards the hopper exit, and the preform and hopper are moved relative to each other. The rods are position by gravity in the upper grooves of the preform.

After a number of the preforms have been loaded with the rods, the loaded preforms are stacked so that the rods are disposed in pockets formed by cooperating upper and lower grooves in the preforms. A soft resin is flowed around the rods and cured in place. After providing electrodes at both ends of the rods, the transducer can then be used to receive or transit electrical signals.

The prior art assembly procedure is characterized by manual assembly steps which require attention to detail and exercise of individual judgement in assembling a transducer from its component parts.

SUMMARY OF INVENTION

An object of this invention is a rod feeder assembly and method for feeding or loading transducer rods automatically into a perforated matrix.

Another object of this invention is the use of pneumatic means for positioning piezoelectric rods in a matrix quickly and efficiency.

Another object of this invention is the use of vibrating rod feeder assembly to align elongated rods in one direction prior to their deposition in the openings of a matrix.

These and other objects of this invention are accomplished by a rod feeder assembly and a method for feeding rods into a perforated matrix. The rod feeder assembly is composed of elongated tubular members arranged in vertical courses and disposed in a box, the tubular members being flush at their downstream end and provided with a loading section at the upstream or the opposite end. The tubular members are of the same length in a course but are shorter in the upper courses. The method is characterized by the steps of (a) disposing elongated rods randomly on the loading sections of a rod feeder assembly composed of elongated support surfaces each having upstream and downstream ends disposed in one direction, the loading sections being located at the upstream ends of the support surfaces, the support surfaces are arranged in at least two vertical courses and being of the same longitudinal extent in a course but shorter in the adjoining higher course, the loading sections are characterized by open areas through which the rods are deposited on the support surfaces, the support surfaces are flush at the downstream end thereof and have a force component that is perpendicular to the longitudinal disposition of the support surfaces;

(b) aligning the rods in the support surfaces; and (c) transferring the rods from the rod feeder assembly to the matrix.

DETAILED DESCRIPTION OF INVENTION

The rod feeder assembly is composed of tubular members disposed in a box open at the top. The loading sections are located at the upstream end of the tubular members. The tubular members provide a support surface having a downward force component and the support surfaces extend the length of the tubular members. The tubular members are arranged in courses and the courses are arranged in parallel, vertically spaced planes disposed directly above the lower plane.

Figure 1:
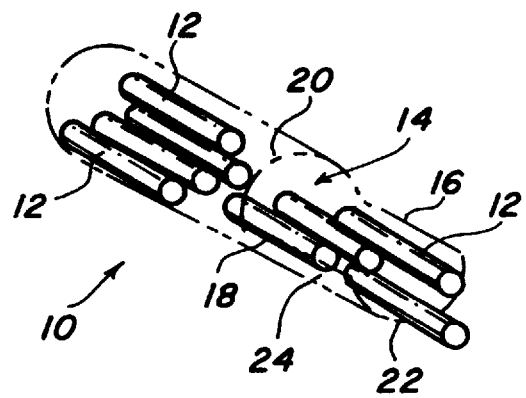
FIG. 1 illustrates a perspective view of a tubular member open at the upstream end containing elongated piezoelectric rods aligned along the axis of the tubular member.

A more detailed description of the rod feeder assembly and the feeding or the loading method is given in connection with FIGS. 1, 2, 3, 4 and 5. In FIG. 1, tubular member 10 is shown in perspective supporting piezoelectric rods 12 in alignment along the longitudinal extent of the tubular member.

The tubular member 10 is an elongated tube that has internal diameter that is many times the diameter of rods 12. Typically, the internal diameter of a tubular member is at least ten times the diameter of the rods. Diameter of a tubular member should be less than the length of the rod so that the rod is prevented from positioning itself within the tube member transversely to the longitudinal axis of the tubular member. Diameter of this tubular member should be less than ⅔ the length of the rod, preferably less than ½. For making transducers, diameter of the tubular member is usually less than 1 cm, preferably less than 0.5 cm but at least 0.01 cm. Length of the tubular member is at least one multiple of the length of a piezoelectric rod 12 and depends on the course in which the tubular member is disposed. Maximum length of a tubular member should not exceed about 20 cm.

The length of a tubular member will depend on its location in an assembly: tubular members located in the higher courses will be shorter than tubular members located in the lower courses. Tubular members in the top course of an assembly should have a length of at least twice the length of a rod and tubular members in the lowest course should have a length of at least three times the length of a rod.

At the upstream end of the tubular member is an open loading section 14, formed by longitudinal form shapes 16, 18 and circumferential form shape 20 in the tubular member. The loading section is open at the top. Longitudinal form shapes 16, 18 define length or longitudinal extent of the loading section which should be at least one-half the length of a rod, preferably about the full length thereof although the loading section can extend the entire length of a tubular member. Longitudinal form shapes 16, 18 with circumferential edge form shape 22 define support surface 24 which supports the rods before they are deposited in a matrix. The support surface, or a portion thereof, is typically below the loading section and is an integral part thereof. Typically, if a rod feeder assembly is used in transducer manufacture, longitudinal extent of the loading section 14 is up to about 5 cm, especially in the range of 0.05–1 cm. Support surface 24, i. e. the bottom surface of the tube, is elongated and curved to impart a downward vector gravitational force on the rods to impel the rods to align along the axis of the tubular member, as shown in FIG. 1. The depth of the support surface can be varied by varying the vertical extent of the longitudinal form shapes 16, 18 so that the loading section is deeper or shallower. Normally, shape forms 16, 18 are provided at about the middle of the vertically extending diameter in which case, form shapes 16, 18 on adjoining tubular members contact or are separated by less than diameter of the rods.

The tubular member 10 shown in FIG. 1 is circular in cross-section, however, it can be of a different cross-section as long as it imparts a downward component force which functions to align the rods along the long axis of the tubular member. Therefore, the term "tubular member" is intended to cover any support surface that can impart a downward aligning force to the rods.

The rods 12 are shown in FIG. 1 aligned along the longitudinal axis of the tubular member 10. The rods are randomly spaced along the longitudinal axis of the tubular member.

The transducer rods are typically circular in cross-section although other shapes can be used. In a preferred embodiment, the transducer rods are circular in cross-section with a diameter of about 0.005 to about 1 cm, especially about 0.01 to about 0.5 cm. If the rods are too thick, the response thereof to an external force is reduced. If the rods are too thin, they are difficult to manufacture and may break readily. The length of the transducer rods depends on the desired characteristics. The transducer rods are typically about as long as the thickness of the matrix and can extend beyond the matrix at one or both ends thereof, but they can also be shorter in which case, the length of the transducer rods is typically about 0.01 to about 5 cm, more typically about 0.05 to about 1 cm. If the rods are too long, the assembly will become massive and if the rods are too short, inadequate electrical signals will be generated.

The transducer rods are made from a suitable sintered piezoelectric ceramic or electrostrictive material. This is typically PZT (lead-zirconium-titanate) or any other stiff piezoelectric or electrostrictive material having a strain coefficient of at least about $10 \times 10^{-12}$ m/volt. In a preferred embodiment, the transducer rods are made from PZT material.

Figure 2:
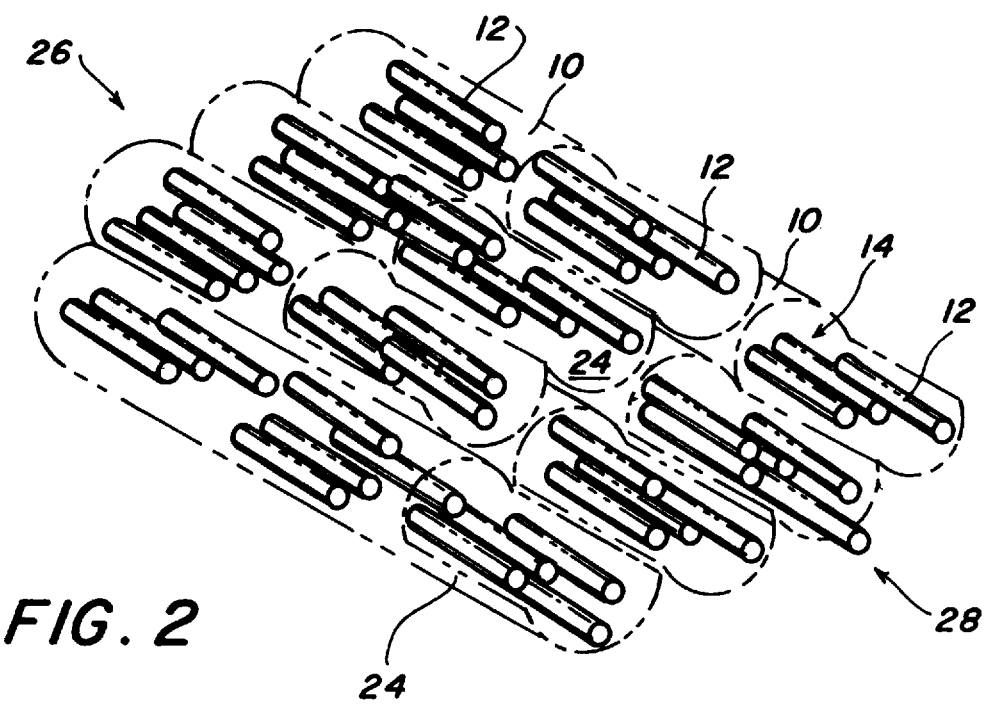
FIG. 2 is a perspective view of upper course or layer and lower course or layer tubular members open at one end containing elongated piezoelectric rods disposed along the axis of the tubular members, with the upper course of tubular members disposed between the lower course tubular members and being shorter than the lower course tubular members.

A plurality of tubular members 10 are shown in the perspective view of FIG. 2 where four tubular members are shown in contact with each other in the first or bottom course and three tubular members are disposed above the first course in the second or top course. Additional tubular members can be arranged in more than two courses. The tubular members in the top course are disposed in the depressions formed by the adjoining tubular members in the bottom course. With diameters of the tubular members being same, the tubular members in the top course are also in contact with the adjoining tubular members in the top course. If gaps between tubular members are large enough for the rods to pass through, ledges can be provided between the tublar members to prevent the rods from falling between the tubular members.

The tubular members in the upper courses can also be positioned directly above the tubular members in the lower course to provide a different arrangement thereof. The tubular members in lower and upper courses can be arranged in any other way to provide a different arrangement. The tubular members can be secured to each other, as by means of an adhesive, for improved structural integrity.

It should be noted that tubular members shown in FIG. 2 are flush at the downstream end marked 26 and are vertically stepped at the upstream end marked 28. The tubular members in a particular course are shown of the same longitudinal extent as the adjacent tubular members, however, tubular members are either shorter or longer depending on whether they are in a lower or upper course.

Figure 3:
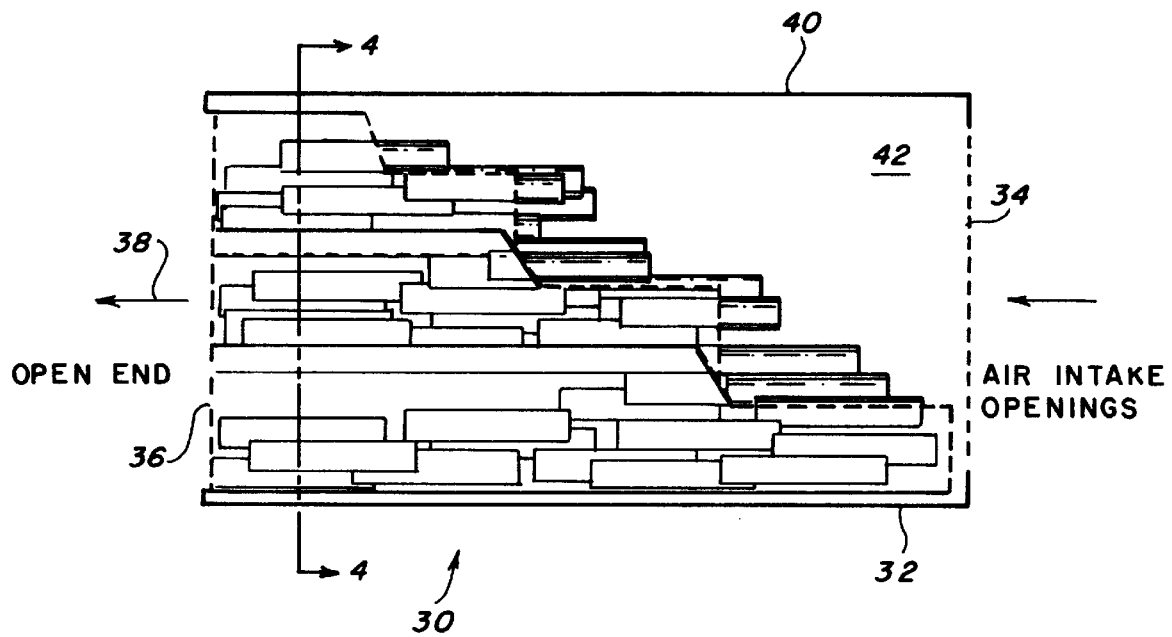
FIG. 3 is a side view of the rod feeder assembly showing rods disposed on the support surfaces and within tubular members.

The rod feeder assembly 30 is shown in FIG. 3 composed of the tubular members disposed in box 32. At the front or the upstream end of the box is front plate 34 perforated to allow air into and through the box. Perforated rear plate 36 is at the rear or downstream end of the box. Rear plate 36 maintains the rods in the tubular members of the rod feeder assembly flush with the downstream end of the tubular members. The sides of the box should be at least as high as the stack of the tubular members and typically are higher by an inch or so or less to accommodate the rods when they are loaded ino the box. When rear plate 36 is removed, the rods leave the rod feeder assembly in the direction of arrow 38 under influence of a force. The sides and top 40 of the rod feeder assembly can be imperforate. The top side 40 of the box can be removable to accommodate feeding the rods into the rod feed assembly from the top. Box 32 can be made of any material desired, such as metal or plastic and any side of the box can be made of a different material than the rest of the box.

Figure 4:
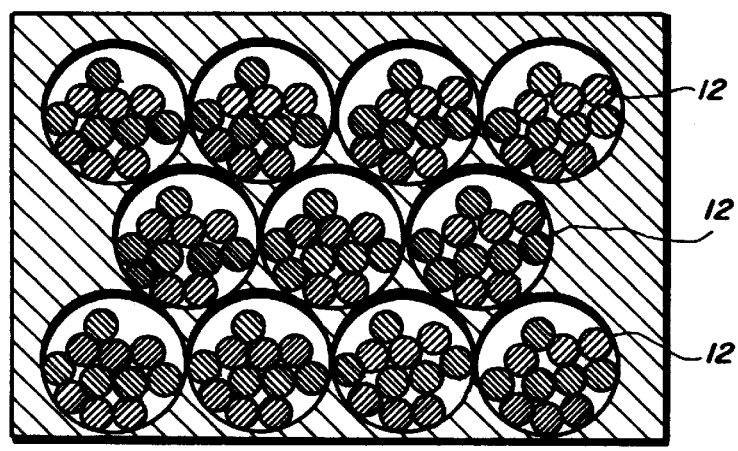
FIG. 4 is a cross-sectional view of the rod feeder assembly shown in FIG. 3.

FIG. 4 is a cross-sectional view along section A—A of FIG. 3 showing three courses of tubular members 12 with four tubular members in the first or the bottom course, three in the second or intermediate course, and four in the third or the top course. In the arrangement shown, the tubular members in the second and third courses are disposed in the spaces formed by the adjoining tubular members in the course directly below and the tubular members in the second and third courses are in separate, vertically spaced planes and parallel to the plane of the first course. The tubular members in the same or a different course can be adhesively secured to each other.

Vibrating unit 42 can be mounted on the rod feeding assembly to vibrate same. The vibrating unit can be mounted anywhere on the rod feeding assembly or the rod feeding assembly can be placed on a vibrator and vibrated without having a vibrating unit thereon.

The method of charging the rods into a matrix is characterized by the use of a rod feeder assembly generally described and illustrated above. The method includes the step of charging or dumping the rods randomly into the rod feeder assembly and onto the tubular members through the open top. To facilitate alignment of the rods in the tubular members, the rod feeder assembly can be inclined and vibrated so that the rods are induced to align along the axes of the tubular members. The inclination of the rod feeder assembly is such that the upstream ends of the tubular members are higher than the opposite ends and the inclination theoretically can be from above 0° to below 90°. In practice, however, inclination of the rod feeder assembly should be less than 45° from the horizontal but more the 10° from the horizontal. Typically, with the rods made from a PZT material being about 1 cm long and about 0.1 cm in diameter, inclination of the rod feeding assembly is in the approximate range of 15°–40° from the horizontal.

Vibration of the rod feeder assembly should be such as to facilitate alignment of the rods in the tubular members, with the rod feeder assembly inclined or maintained horizontal. Of course, vibration should be less intense with greater inclination and more intense with smaller inclination or with the rod feeder assembly disposed horizontally.

The purpose of inclination and vibration of the rod feeding assembly is quick and efficient alignment of the rods along the axes of the tubular members. The greater the inclination and the greater the vibration of the rod feeder assembly will result in a quicker alignment of the rods and more aligned rods in the tubular members. If vibration and/or inclination is decreased, duration of the alignment procedure will be prolonged and fewer rods may be aligned in the tubular members. Inclination and/or vibration of the rod feeder assembly can be in effect when the rods are charged into the rod feeder assembly although typically, the rod feeder assembly is already inclined and vibrated when the rods are charged.

In order to transfer the rods from the rod feeder assembly to a matrix, the downstream or the rear end of the rod feeder assembly is positioned or is disposed against the upstream or the front end of the matrix and rear plate 36 is removed. If the rod feeder assembly is inclined when the rods are aligned in the tubular members, the matrix is likewise inclined when brought against the rear end of the rod feeder assembly although this need not be so. The matrix can be disposed horizontally when the rods are transferred from the inclined rod feeder assembly to the matrix. Also, if the rod feeder assembly is vibrated while the transfer of the rods is being made, some of that beneficial vibration will be imparted to the matrix if the rod feeder assembly is against the matrix.

Figure 5:
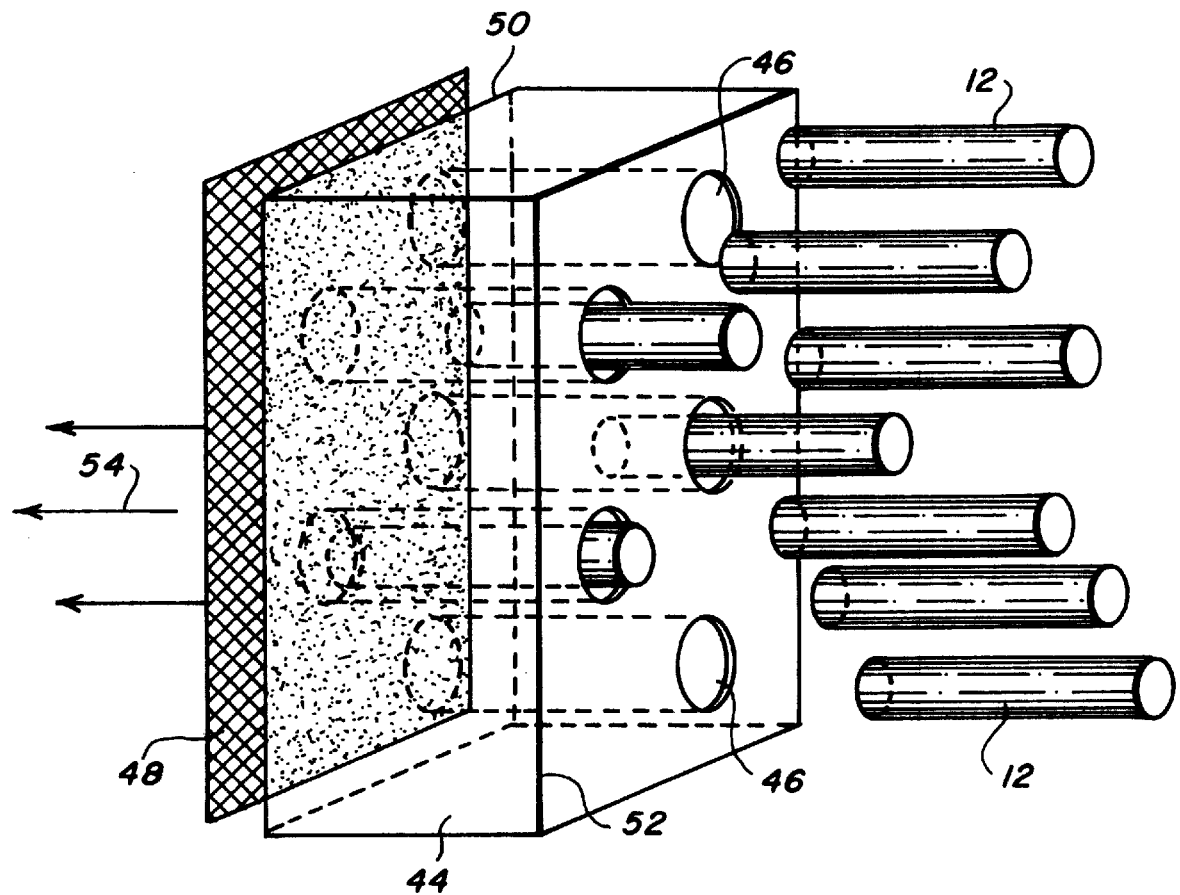
FIG. 5 is a perspective view of the piezoelectric rods being deposited into the openings in the polymer matrix.

When the transfer of the rods is to be made from the rod feeder assembly to the matrix 44 provided with openings 46, shown in FIG. 5, a force is exerted on the rods to at least facilitate the transfer. The force can be air under pressure which carries the rods from the rod feeder assembly into the matrix. Wire screen 48 is placed against the downstream end 50 of the matrix 44 to longitudinally align and position rods 12 in openings 46. Suction can be used to facilitate transfer the rods from the rod feeder assembly into the matrix by pulling suction in the direction of arrow 54 in FIG. 5. The wire screen 48 is again applied against the downstream end of the matrix to limit the lateral movement of the rods into the matrix.

Position of the wire screen 48 relative to the matrix 44 can be used to control longitudinal position of the rods. If it is desired to have the rods flush with the downstream end of the matrix, the wire screen is held flush against the downstream end 50 of the matrix. If it is desired to have the rods extend beyond the matrix, the wire screen is spaced a distance from downstream end of the matrix so that the rods extend beyond the matrix.

The force applied to the rods should be sufficient to at least facilitate their transfer into the matrix. This force will be lesser or greater depending on whether additional means are used to facilitate the transfer. For instance, if the rod feeder assembly is inclined and/or vibrated, a lesser force will be required to move the rods from the rod feeder assembly into the matrix, however, in absence of inclination and/or vibration, a greater force will be required. In an arrangement where the PZT transducer rods are on the order of 1 cm long, 0.1 cm in diameter and weigh about 0.1 gm, it was found that suction defined by a viscous air flow which is rough vacuum of about 1 to 500 torr and air flow of Reynold's number of about less than 2200, facilitated transfer of the rods from the rod feeder assembly into openings in the matrix that were larger than the rods. If the openings in the matrix are such that the rods fit thereinto snugly, assuming a relatively soft matrix, then a greater suction will be required to position the rods within the matrix.

Once the rods are positioned within the matrix to form a transducer unit or another article, the article is processed in accordance with a set procedure to make a transducer or a final article.

The invention having been generally described, the following example is given as a particular embodiment of the invention to demonstrate the practice and advantages thereof. It is understood that the example is given by way of illustration and is not intended to limit in any manner the specification or any claim that follows.

EXAMPLE

This example illustrates a rod feeder assembly and aligning of PZT transducer rods in a matrix using the rod feeder assembly.

The rod feeder assembly of this example had eight vertical courses with each course including plastic tubes of 0.56 cm in internal diameter and wall thickness of 0.02 cm. The tubes were of equal length in a given course but decreased in length from the top to lower courses. Each course was made from tubes arranged in a plane. Starting from the bottom of the rod feeder assembly, the first course contained 10 tubes arranged in a plane next to each other in contact with the adjoining tubes and secured to each other with Elmer's Glue-All® adhesive along the contacting surfaces. The lengths of the tubes in the first course was 15.0 cm. The upstream end of each tube contained a loading section open at the top which was 1.5 cm in longitudinal extent, as illustrated in FIG. 1. The same open section was provided at one end of each tube in the rod feeder assembly.

The second course contained 9 tubes and the tubes in this course were disposed above the tubes in the first course in depressions created by the tubes in the first course, in a manner illustrated in FIG. 4. The tubes in the second course were adhesively secured to the tubes in the first course and to each other along contacting surfaces. The tubes in the second course were flush along a vertical plane with the tubes in the first course at the downstream ends thereof but were spaced inwardly at the opposite or the upstream ends thereof where the loading sections were located, as illustrated in FIG. 2.

Course three contained 10 tubes arranged as in the lower course. Courses 4 to 8 contained an alternating number of 9 or 10 tubes arranged in the same way as tubes in the lower courses. The top or the eighth course contained 9 tubes each 4.5 cm long. The tubes in all eight courses were placed in a plastic box composed of six side plates made from transparent plastic. The top and end plates were removable.

All tubes in the rod feeder assembly were adhesively secured to each other and their downstream ends were aligned along a vertical plane.

The method of using the rod feeder assembly presupposed removal of the top plate but presence of the end plates. The method included the steps of randomly loading or feeding the rods through the open top of the rod feeder assembly onto the tubular members. Each rod was made from PZT–5H material, was 1.27 cm in length, 0.116 cm in diameter, and weighed about 0.1 gram. These rods were deposited on tubes in the rod feeder assembly randomly through the open top and vibrated on a vibrator while maintaining 3the rod feeder assembly inclined in the downstream directed at about 30° from the horizontal. It took about 5–10 seconds to align and position about 2000 rods in the tubes of the rod feeder assembly described in this example. At this point, the rods were aligned and positioned in and along the tubular members or the tubes.

Transfer of the rods from the rod feeder assembly to the matrix was accomplished by removing the downstream plate on the assembly and bringing the downstream end thereof against the perforated matrix. The opposite end of the matrix was affixed to the suction motor of a Douglas portable vacuum cleaner Model No. 6700 with a motor rating of 25 volts, 2.2 amps and frequency of 64 Hz. With the rod feeder assembly in an inclined position under vibration and a wire screen against the downstream end of the matrix to contain the rods in the matrix, the rods were transferred in a couple of minutes into the openings in the matrix under action of the suction force. The openings in the matrix were about 0.18 cm in diameter and they were arranged in the matrix in a hexagonal pattern with a center-to-center distance of 0.28 cm. The matrix dimensions were 36 cm×36 cm×0.6 cm with openings therein disposed along the thickness thereof. The matrix was made from a hard polycarbonate plastic with a Poisson's ratio of 0.4, Modulus of Elasticity of 2.4 GPa and density of 1.2 g/cc.

Many modifications and variations of the present invention are possible in light of the above teachings. It is, therefore, to be understood that within the scope of the appended claims, the invention may be practiced otherwise than as specifically described.

What is claimed is:

1. An article comprising elongated tubular members secured to each other, said tubular members having support surfaces disposed parallel to each other and arranged in courses; said support surfaces in a course being arranged in a first plane, having upstream and downstream ends with the downstream ends aligned in a second plane disposed perpendicularly to the disposition of said support surfaces, and have a force component that is perpendicular to the disposition of said support surfaces; and loading sections at upstream location of said support surfaces that are open from one direction.

2. The article of claim 1 disposed in a box having side plates and end plates at upstream and downstream ends of said support surfaces; said loading sections being open in a direction; and said support surfaces in a given course are of the same longitudinal extent but being longer than support surfaces in higher courses.

3. The article of claim 2 wherein internal diameter of said tubular members is less than 1 cm and wherein longitudinal extent of said loading sections in up to about 5 cm.

4. The article of claim 2 wherein internal diameter of said tubular members is in the range of 0.01–0.5 cm and longitudinal extent of said loading sections is in the range of 0.05–1 cm.

5. The article of claim 4 wherein number of tubular member in a course 3–100 and number of courses in the article is 3–20.

6. The article of claim 4 wherein number of tubular members in a course in 5–50 and number of courses in the article is 5–15.

7. The article of claim 4 wherein the difference in longitudinal extent of said tubular members in different courses is a multiple of the longitudinal extent of said loading section.

8. The article of claim 7 wherein each of said loading sections are at the upstream end of its corresponding tubular members and extends to about the middle of said corresponding tubular members, and there is the same number of said tubular members in the bottom course as the top course in said article.

9. The article of claim 8 wherein one of said side plates are longer than said end plates.

* * * * *